US008058657B2

(12) United States Patent
Lee et al.

(10) Patent No.: US 8,058,657 B2
(45) Date of Patent: Nov. 15, 2011

(54) DISPLAY DEVICE

(75) Inventors: Younghak Lee, Gumi-si (KR); Jaemin Seok, Daiseo-gu (KR)

(73) Assignee: LG Display Co., Ltd., Seoul (KR)

( * ) Notice: Subject to any disclaimer, the term of this patent is extended or adjusted under 35 U.S.C. 154(b) by 167 days.

(21) Appl. No.: 12/470,097

(22) Filed: May 21, 2009

(65) Prior Publication Data

US 2010/0140622 A1 Jun. 10, 2010

(30) Foreign Application Priority Data

Dec. 8, 2008 (KR) ........................ 10-2008-0124244

(51) Int. Cl.
*H01L 27/15* (2006.01)
*H01L 29/16* (2006.01)
*H01L 31/12* (2006.01)
*H01L 33/00* (2010.01)

(52) U.S. Cl. ..... 257/83; 257/80; 257/462; 257/E31.073; 257/E31.079; 257/E31.082; 438/30

(58) Field of Classification Search .................... 257/59, 257/72, E29.294, E21.414, E29.291, 80, 257/83, 462, E31.073, E31.079, E31.082; 438/158, 30

See application file for complete search history.

(56) References Cited

U.S. PATENT DOCUMENTS

| | | | | |
|---|---|---|---|---|
| 5,200,634 | A * | 4/1993 | Tsukada et al. | 257/291 |
| 6,255,705 | B1 * | 7/2001 | Zhang et al. | 257/412 |
| 7,242,449 | B1 * | 7/2007 | Yamazaki et al. | 349/116 |
| 7,586,254 | B2 * | 9/2009 | Kwak et al. | 313/504 |
| 7,977,681 | B2 * | 7/2011 | Im et al. | 257/72 |
| 2005/0258744 | A1 * | 11/2005 | Kwak et al. | 313/504 |
| 2009/0032823 | A1 * | 2/2009 | Im et al. | 257/80 |

* cited by examiner

*Primary Examiner* — Zandra Smith
*Assistant Examiner* — Jeremy Joy
(74) *Attorney, Agent, or Firm* — Brink Hofer Gilson & Lione (57) ABSTRACT

A thin film transistor comprises: a first transistor region and a second transistor region defined on a substrate; and a first transistor and a second transistor respectively disposed on the first and second transistor regions, the first transistor comprising: a first semiconductor layer having source, channel, and drain regions defined on the substrate; a first insulating film disposed on the first semiconductor layer; a first transparent electrode disposed on the first insulating film and formed corresponding to the channel region of the first semiconductor layer; and a second insulating film disposed on the first transparent electrode, and the second transistor comprising: a second semiconductor layer having source, channel, and drain regions defined on the substrate; the first insulating film disposed on the second semiconductor layer; a second transparent electrode disposed on the first insulating film and formed corresponding to the channel region of the second semiconductor layer; a second gate disposed on the second transparent electrode; and the second insulating film disposed on the second gate.

8 Claims, 6 Drawing Sheets

DISPLAY DEVICE

RELATED APPLICATIONS

This application claims the benefit of Korean Patent Application No. 10-2008-124244 filed on Dec. 8, 2008, which is hereby incorporated by reference in its entirety.

BACKGROUND

1. Field

This document relates to a thin film transistor, a fabricating method of a thin film transistor, and a display device using the same.

2. Related Art

With the development of the information technology, the market of display devices, that is, connection media between users and information has been expanded. In line with this trend, the use of a flat panel display (FPD), such as a liquid crystal display (LCD), an organic light emitting diode (OLED), and a plasma display panel (PDP), has increasing. Of these, a liquid crystal display, which can implement high resolutions, can be miniaturized and made and can have a large screen size, has been widely used.

Some of the above-mentioned display devices display an image by being driven by thin film transistors formed on a substrate and data stored in capacitors. The thin film transistor may include a gate, a semiconductor layer, a source, and a drain which are formed on a substrate.

Representative display devices driven by thin film transistors include an organic light emitting display and a liquid crystal display. The organic light emitting display is classified as a self-luminous display device, and the liquid crystal display is classified as a light-receiving type display device.

Each of these display devices may have a normal transistor that operates by a voltage supplied to the gate during a thin film transistor formation process and a phototransistor that operates by a channel formed by an external light. Herein, the phototransistor, which is a sensor, is configured circuitally so as to adjust the luminance of a panel by external light.

Conventionally, in a thin film transistor process, an additional process, such as the formation of a doping mask, is performed to dope source and drain regions of a transistor with impurities during the formation of a normal transistor and a phototransistor. In this case, an alignment process for covering a channel region by a mask has to be performed, and this leads to a decrease in production yield in the manufacture of a thin film transistor. Therefore, a solution for this problem is required.

BRIEF SUMMARY

An exemplary embodiment of the disclosure in this document provides a thin film transistor, comprising: a first transistor region and a second transistor region defined on a substrate; and a first transistor and a second transistor respectively disposed on the first and second transistor regions, the first transistor comprising: a first semiconductor layer having source, channel, and drain regions defined on the substrate; a first insulating film disposed on the first semiconductor layer; a first transparent electrode disposed on the first insulating film and formed corresponding to the channel region of the first semiconductor layer; and a second insulating film disposed on the first transparent electrode, and the second transistor comprising: a second semiconductor layer having source, channel, and drain regions defined on the substrate; the first insulating film disposed on the second semiconductor layer; a second transparent electrode disposed on the first insulating film and formed corresponding to the channel region of the second semiconductor layer; a second gate disposed on the second transparent electrode; and the second insulating film disposed on the second gate.

In an aspect, an exemplary embodiment provides a thin film transistor, comprising: a first transistor region and a second transistor region defined on a substrate; and a first transistor and a second transistor disposed on the first and second transistor regions, the first transistor comprising: a first semiconductor layer having source, channel, and drain regions defined on the substrate; a first insulating film disposed on the first semiconductor layer; a first transparent electrode disposed on the first insulating film and formed corresponding to the channel region of the first semiconductor layer; and a second insulating film disposed on the first transparent electrode and having an opening exposing the first transparent electrode, and the second transistor comprising: a second semiconductor layer having source, channel, and drain regions defined on the substrate; the first insulating film disposed on the second semiconductor layer; a second transparent electrode disposed on the first insulating film and formed corresponding to the channel region of the second semiconductor layer; a second gate disposed on the second transparent electrode; and the second insulating film disposed on the second gate.

In another aspect, an exemplary embodiment of the disclosure provides a thin film transistor fabricating method, comprising: defining a first transistor region and a second transistor region on a substrate; forming a first semiconductor layer and a second semiconductor layer on the first and second transistor regions; forming a first insulating film on the first semiconductor layer and the second semiconductor layer; forming a first transparent electrode corresponding to a channel region of the first semiconductor layer and a second transparent electrode corresponding to a channel region of the second semiconductor layer on the first insulating film and forming a second gate on the second transparent electrode; and forming a second insulating film on the first transparent electrode and the second gate.

In another aspect, an exemplary embodiment provides a thin film transistor fabricating method, comprising: defining a first transistor region and a second transistor region on a substrate; forming a first semiconductor layer and a second semiconductor layer on the first and second transistor regions; forming a first insulating film on the first semiconductor layer and the second semiconductor layer; forming a first transparent electrode corresponding to a channel region of the first semiconductor layer and a second transparent electrode corresponding to a channel region of the second semiconductor layer and forming a first gate and a second gate on the first transparent electrode and the second transparent electrode, respectively; forming a second insulating film on the first transparent electrode and the second gate; forming an opening exposing the first gate on the second insulating film; and removing the first gate exposed through the opening formed on the second insulating film.

BRIEF DESCRIPTION OF THE DRAWINGS

The accompany drawings, which are included to provide a further understanding of the invention and are incorporated on and constitute a part of this specification illustrate embodiments of the invention and together with the description serve to explain the principles of the invention.

DETAILED DESCRIPTION OF THE DRAWINGS AND THE PRESENTLY PREFERRED EMBODIMENTS

Reference will now be made in detail embodiments of the invention examples of which are illustrated in the accompanying drawings.

Hereinafter, an implementation of this document will be described in detail with reference to the attached drawings.

First Exemplary Embodiment

Figure 1:
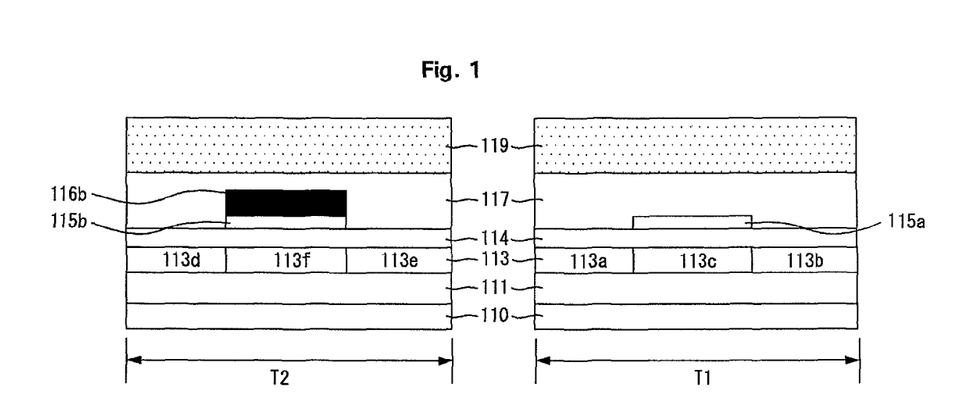
FIG. 1 is a cross sectional view of a thin film transistor in accordance with a first exemplary embodiment.

As shown in FIG. 1, in a first exemplary embodiment, a first transistor region T1 and a second transistor region T2 are defined on a substrate 110. A first transistor and a second transistor are disposed in the first transistor region T1 and the second transistor region T2, respectively.

The first transistor may comprise a buffer layer 111 disposed on the substrate 110, a first semiconductor layer 113 having a source region 113a, a channel region 113c, and a drain region 113b defined on the buffer layer 111, a first insulating film 114 disposed on the first semiconductor layer 113, a first transparent electrode 115a disposed on the first insulating film 114 and formed corresponding to the channel region 113c of the first semiconductor layer 113, a second insulating film 117 disposed on the first transparent electrode 115a, and a third insulating film 119 disposed on the second insulating film 117.

The second transistor may comprise a buffer layer 111 disposed on the substrate 110, a second semiconductor layer 113 having a source region 113d, a channel region 113f, and a drain region 113e defined on the buffer layer 111, a first insulating film 114 disposed on the second semiconductor layer 113, a second transparent electrode 115b disposed on the first insulating film 114 and formed corresponding to the channel region 113f of the second semiconductor layer 113, a second gate 116b disposed on the second transparent electrode 115b, a second insulating film 117 disposed on the second gate 116b, and a third insulating film 119 disposed on the second insulating film 117.

In the above description, the first transistor is formed of a phototransistor having a channel formed by external light, and the second transistor is formed of a top gate type normal transistor having a channel formed by a voltage supplied to the second gate.

Hereinafter, a thin film transistor fabricating method in accordance with the first exemplary embodiment of the present invention will be described.

Figure 2:
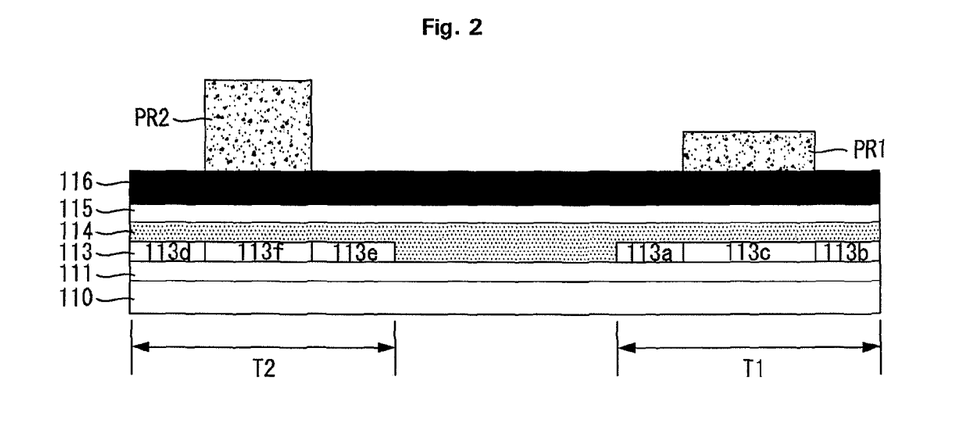
FIGS. 2 to 5 are process flow charts for explaining a thin film transistor fabricating method in accordance with the first exemplary embodiment.

First, as shown in FIG. 2, a first transistor region T1 and a second transistor region T2 are defined on a substrate 110. A buffer layer 111 may be disposed on the substrate 110 on which the first transistor region T1 and the second transistor region T2 are defined. The buffer layer 111 may be formed to protect a transistor to be formed in a subsequent process from impurities such as an alkali ion leaking from the substrate 110. The buffer layer 111 may be made of silicone oxide (SiOx), silicone nitride (SiNx), or the like.

Next, as shown in FIG. 2, a first semiconductor layer 113a, ..., 113c and a second semiconductor layer 113d, ..., 113f are formed in the first transistor region T1 and the second transistor region T2. The first semiconductor layer 113a, ..., 113c and the second semiconductor layer 113d, ..., 113f may include amorphous silicon or crystallized polycrystalline silicon.

Next, as shown in FIG. 2, a first insulating film 114 is formed on the first semiconductor layer 113a, ..., 113c and the second semiconductor layer 113d, ..., 113f. The first insulating film 114 may be made of silicon oxide (SiOx), silicone nitride (SiNx), or multi-layers thereof, but is not restricted thereto.

Next, as shown in FIG. 2, a transparent metal 115 is formed on the first insulating film 114. The transparent metal 115 may be formed of any one of ITO (Indium Tin Oxide), IZO (Indium Zinc Oxide), ITZO (Indium Tin Zinc Oxide), and AZO (Zno doped Al2O3), but is not restricted thereto.

Next, as shown in FIG. 2, a gate metal 116 is formed on the transparent metal 115. The gate metal 116 may be formed of a single layer or multi-layer formed of any one selected from the group consisting of molybdenum (Mo), aluminum (Al), chromium (Cr), gold (Au), titanium (Ti), nickel (Ni), neodymium (Nd) and copper (Cu), or a combination thereof.

Next, as shown in FIG. 2, a first photoresistor PR1 and a second photoresistor PR2 respectively corresponding to a channel region 113c of the first semiconductor layer and a channel region 113f of the second semiconductor layer are formed on the gate metal 116.

Figure 3:
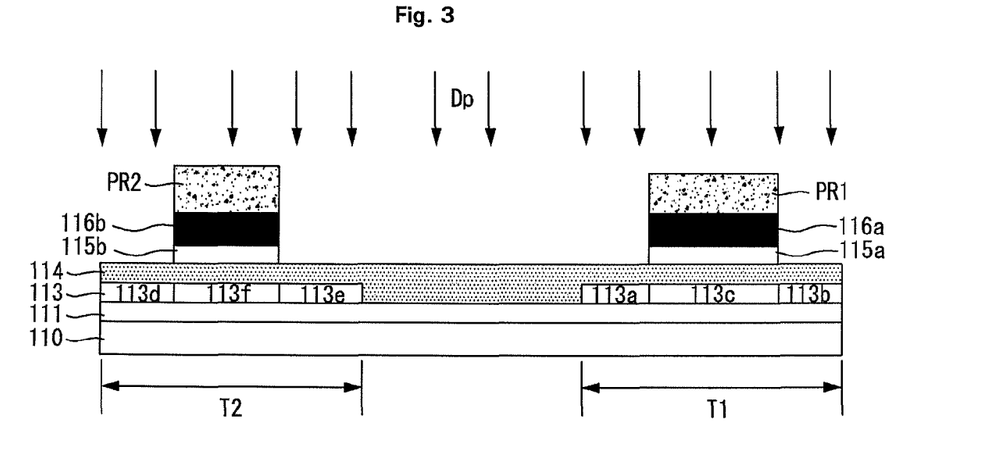

Next, as shown in FIG. 3, portions of the gate metal 116 and the transparent metal 115 are removed by using the first photoresistor PR1 and the second photoresistor PR2, and a first gate 116a, a first transparent electrode 115a, a second gate 116b, and a second transparent electrode 115b are formed. Dry etching (D/E) may be used for removing a portion of the gate metal 116, and wet etching (W/E) may be used for removing a portion of the transparent metal 115. However, the present invention is not restricted thereto.

Next, as shown in FIG. 3, source and drain regions 113a and 113b of the first semiconductor layer and source and drain regions 113d and 113e of the second semiconductor layer are doped (Dp) with impurities. The impurities may be a P-type or N-type.

Figure 4:
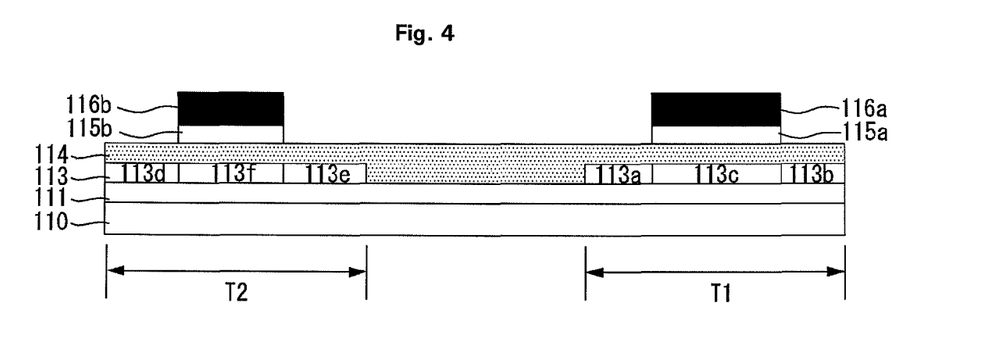

Next, as shown in FIG. 4, the first photoresistor PR1, second photoresistor PR2, and first gate 116a are removed to thus form a first transparent electrode 115a corresponding to the channel region 113d of the first semiconductor layer and a second transparent electrode 115b corresponding to the channel region 113f of the second semiconductor layer on the first insulating film 114 and to form a second gate 116b on the second transparent electrode 115b. Wet etching (W/E) may be used for removing the first gate 116a, and a strip method may be used for removing the first photoresistor PR1 and the second photoresistor PR2. However, the present invention is not restricted thereto.

Figure 5:
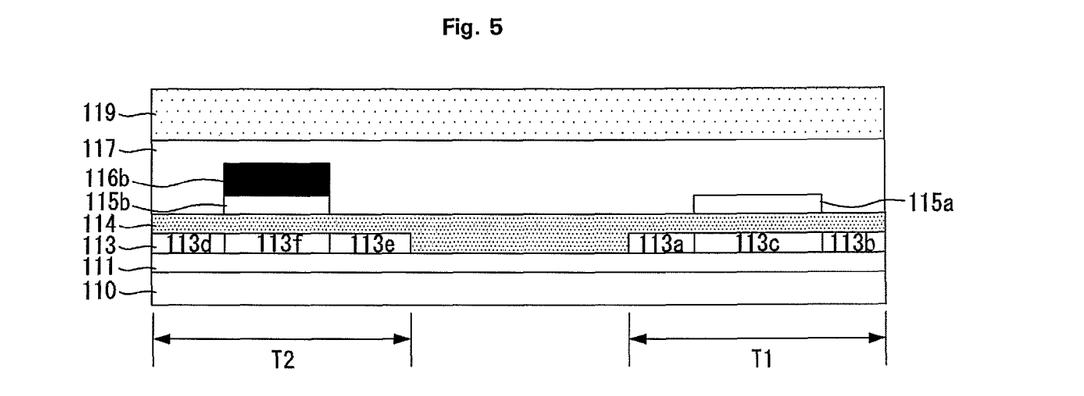

Next, as shown in FIG. 5, a second insulating film 117 is formed on the first transparent electrode 115a and the second gate 116a. The second insulating film 117 may be made of silicon oxide (SiOx), silicone nitride (SiNx), or multi-layers thereof, but is not restricted thereto. Although not shown, a source and a drain which contact the source and drain regions 113a and 113b of the first semiconductor layer and the source and drain regions 113d and 113e of the second semiconductor layer, respectively, may be disposed on the second insulating film 117. Therefore, the illustrated third insulating film 119 is formed on the source and drain.

As for the above-described thin film transistor in accordance with the exemplary embodiment of the present invention, a mask process for carrying out an impurity doping process on the source and drain regions of the semiconductor layers is omitted in the process of forming a phototransistor and a normal transistor on the substrate. This is because, as the mask is replaced with the first and second transparent electrodes formed on the first insulating film, a self-aligned doping is enabled. Additionally, the thin film transistor in accordance with the exemplary embodiment of the present invention can improve reliability and enhance production yield and product competitiveness since a phototransistor and a normal transistor have the same structure.

Hereinafter, an organic light emitting display manufactured according to the first exemplary embodiment of the present invention will be described.

Figure 6:
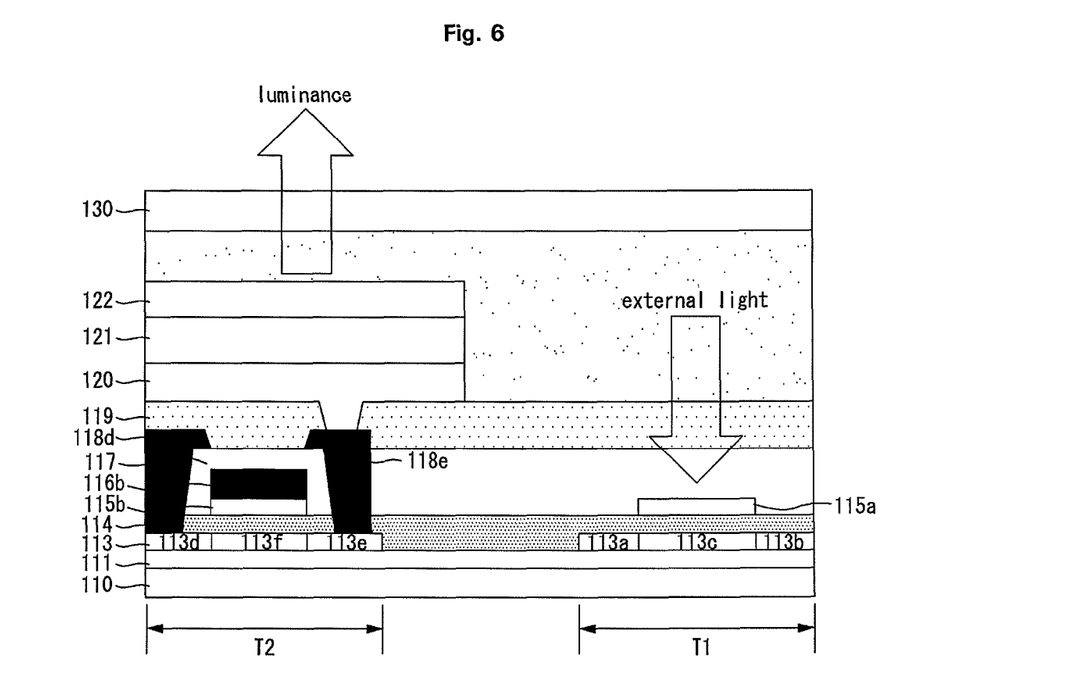
FIG. 6 is a schematic cross sectional view of an organic light emitting display manufactured in accordance with the first exemplary embodiment.

As shown in FIG. 6, a first substrate 110 defining a first transistor region T1 and a second transistor region T2 is disposed on a panel of an organic light emitting display manufactured in accordance with the first exemplary embodiment of the present invention.

A buffer layer 111 is disposed on the first substrate 110. The buffer layer 111 may be formed to protect a transistor to be formed in a subsequent process from impurities such as an alkali ion leaking from the substrate 110. The buffer layer 111 may be made of silicone oxide (SiOx), silicone nitride (SiNx), or the like.

A first semiconductor layer 113a, . . . , 113c and a second semiconductor layer 113d, . . . , 113f partitioned off on the first transistor region T1 and on the second transistor region T2 are disposed on the buffer layer 111. The first semiconductor layer 113a, . . . , 113c and the second semiconductor layer 113d, . . . , 113f may include amorphous silicon or crystallized polycrystalline silicon.

A first insulating film 114 is formed on the first semiconductor layer 113a, . . . , 113c and the second semiconductor layer 113d, . . . , 113f. The first insulating film 114 may be made of silicon oxide (SiOx), silicone nitride (SiNx), or multi-layers thereof, but is not restricted thereto.

On the first insulating film 114, a first transparent electrode 115a disposed on the channel region 113c of the first semiconductor layer and a second transparent electrode 115b disposed on the channel region 113f of the second semiconductor layer may be formed on the first insulating film 114. The first and second transparent electrodes 115a and 115b may be formed of any one of ITO (Indium Tin Oxide), IZO (Indium Zinc Oxide), ITZO (Indium Tin Zinc Oxide), and AZO (Zno doped Al2O3), but are not restricted thereto.

A second gate 116b is disposed on the second transparent electrode 115b. The second gate 116b may be formed of a single layer or multi-layer formed of any one selected from the group consisting of molybdenum (Mo), aluminum (Al), chromium (Cr), gold (Au), titanium (Ti), nickel (Ni), neodymium (Nd) and copper (Cu), or a combination thereof.

A second insulating film 117 is formed on the first transparent electrode 115a and the second gate 116b. The second insulating film 117 may be made of silicon oxide (SiOx), silicone nitride (SiNx), or multi-layers thereof, but is not restricted thereto.

A source 118d and a drain 118e which contact the source and drain regions 113d and 113e of the second semiconductor layer are disposed on the second insulating film 117. Although not shown, the source and drain are disposed so as to be in contact with the source and drain regions 113a and 113b of the first semiconductor layer.

A third insulating film 119 exposing the source 118d or the drain 118e is disposed on the source and drain 118d and 118e. The third insulating film 119 may be made of silicon oxide (SiOx), silicone nitride (SiNx), or multi-layers thereof, but is not restricted thereto.

A lower electrode 120 contacting the source 118d or drain 118e is disposed on the third insulating film 119. As the lower electrode 120, a cathode or anode may be selected. If a cathode is selected as the lower electrode 120, the lower electrode 120 may be formed of any one of aluminum (Al), an aluminum alloy (Al alloy), and aluminum neodymium (AlNd).

An organic light emitting layer 121 is disposed on the lower electrode 120. The organic light emitting layer 121 may include a hole injection layer, a hole transport layer, a light emitting layer, an electron transport layer, and an electron injection layer, but is not limited thereto.

An upper electrode 122 is disposed on the organic light emitting layer 121. As the upper electrode 122, an anode or cathode may be selected. If an anode is selected as the upper electrode 122, the upper electrode 122 may be formed of any one of ITO (Indium Tin Oxide), IZO (Indium Zinc Oxide), ITZO (Indium Tin Zinc Oxide), and AZO (Zno doped Al2O3), but is not restricted thereto.

In the case of the organic light emitting display having the above structure, a second substrate 130 may be provided and joined and sealed so as to protect an element formed on the first substrate 110 from moisture or oxygen. The organic light emitting display manufactured as above may comprise a data driver and a scan driver that supply a data signal and a scan signal. Therefore, the organic light emitting display in accordance with the exemplary embodiment can be manufactured as a display device capable of representing an image by a data signal and a scan signal that are supplied from the data driver and the scan driver.

Meanwhile, a phototransistor is formed in the first transistor region T1, and a normal transistor is formed in the second transistor region T2. In the exemplary embodiment, the first transistor formed in the first transistor region T1 may operates as a phototransistor for sensing external light, and the second transistor formed in the second transistor region may operate as a normal transistor for driving an organic light emitting diode formed in a pixel area. Accordingly, the organic light emitting display in accordance with the exemplary embodiment is able to adjust the luminance of a pixel by means of external light.

A method of adjusting the luminance of a pixel by using a phototransistor is one of the methods for adjusting the luminance of a display device, so that those skilled in the art may implement the present invention by configuring the phototransistor circuitally so as to work in conjunction with the data driver. According to the method of adjusting the luminance of a pixel by using a phototransistor, the luminance of a pixel can be increased in a bright environment, while the luminance of a pixel can be decreased in a dark environment, thereby improving visibility and reducing power consumption. Consequently, the exemplary embodiment can provide a thin film transistor and an organic light emitting display that can realize an ALS (Ambient Light Sensor).

Second Exemplary Embodiment

Figure 7:
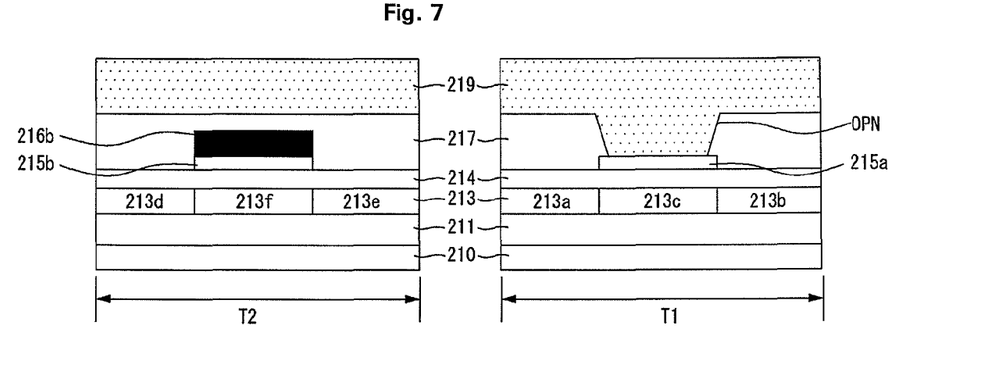
FIG. 7 is a cross sectional view of a thin film transistor in accordance with the first exemplary embodiment.

As shown in FIG. 7, a first transistor region T1 and a second transistor region T2 are defined on a substrate 110. A first transistor and a second transistor are disposed in the first transistor region T1 and the second transistor region T2, respectively.

The first transistor may comprise a buffer layer 211 disposed on the substrate 210, a first semiconductor layer 213 having a source region 213a, a channel region 213c, and a drain region 213b defined on the buffer layer 211, a first insulating film 214 disposed on the first semiconductor layer 213, a first transparent electrode 215a disposed on the first insulating film 214 and formed corresponding to the channel region 213c of the first semiconductor layer 213, and a second insulating film 217 disposed on the first transparent electrode 215a and having an opening OPN exposing the first transparent electrode 215a.

The second transistor may comprise a buffer layer 211 disposed on the substrate 210, a second semiconductor layer 213 having a source region 213a, a channel region 213c, and a drain region 213b defined on the buffer layer 211, a first insulating film 214 disposed on the second semiconductor layer 213, a second transparent electrode 215b disposed on the first insulating film 214 and formed corresponding to the channel region 213f of the second semiconductor layer 213, a second gate 216b disposed on the second transparent electrode 215b, and a second insulating film 217 disposed on the second gate 216b.

In the above explanation, the first transistor is formed as a phototransistor whose channel is formed by external light, and the second transistor is formed as a top gate type normal transistor whose channel is formed by a voltage supplied to the second gate.

Hereinafter, a thin film transistor fabricating method in accordance with a second exemplary embodiment of the present invention will be described.

Figure 8:
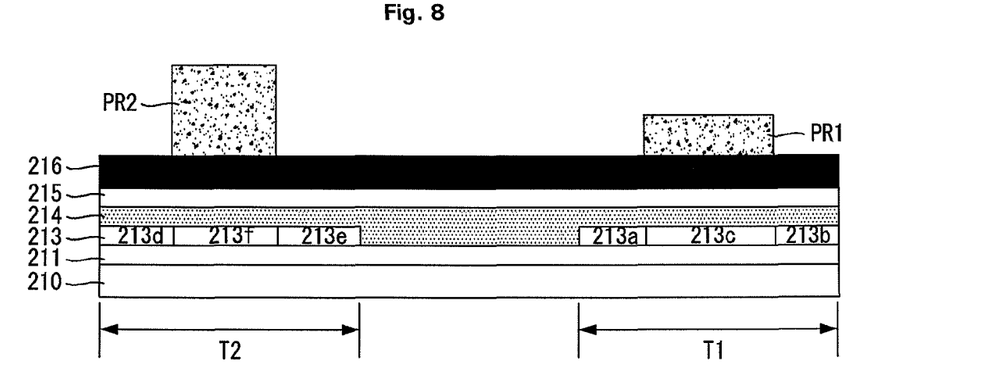
FIGS. 8 to 12 are process flow charts for explaining a thin film transistor fabricating method in accordance with a second exemplary embodiment.

First, as shown in FIG. 8, a first transistor region T1 and a second transistor region T2 are defined on a substrate 210. A buffer layer 211 may be disposed on the substrate 210 on which the first transistor region T1 and the second transistor region T2 are defined. The buffer layer 211 may be formed to protect a transistor to be formed in a subsequent process from impurities such as an alkali ion leaking from the substrate 210. The buffer layer 211 may be made of silicone oxide (SiOx), silicone nitride (SiNx), or the like.

Next, as shown in FIG. 8, a first semiconductor layer 213a, . . . , 213c and a second semiconductor layer 213d, . . . , 213f are formed in the first transistor region T1 and the second transistor region T2. The first semiconductor layer 213a, . . . , 213c and the second semiconductor layer 213d, . . . , 213f may include amorphous silicon or crystallized polycrystalline silicon.

Next, as shown in FIG. 8, a first insulating film 214 is formed on the first semiconductor layer 213a, . . . , 213c and the second semiconductor layer 213d, . . . , 213f. The first insulating film 214 may be made of silicon oxide (SiOx), silicone nitride (SiNx), or multi-layers thereof, but is not restricted thereto.

Next, as shown in FIG. 8, a transparent metal 215 is formed on the first insulating film 214. The transparent metal 215 may be formed of any one of ITO (Indium Tin Oxide), IZO (Indium Zinc Oxide), ITZO (Indium Tin Zinc Oxide), and AZO (Zno doped Al2O3), but is not restricted thereto.

Next, as shown in FIG. 8, a gate metal 216 is formed on the transparent metal 215. The gate metal 216 may be formed of a single layer or multi-layer formed of any one selected from the group consisting of molybdenum (Mo), aluminum (Al), chromium (Cr), gold (Au), titanium (Ti), nickel (Ni), neodymium (Nd) and copper (Cu), or a combination thereof.

Next, as shown in FIG. 8, a first photoresistor PR1 and a second photoresistor PR2 corresponding to a channel region 213c of the first semiconductor layer and a channel region 213f of the second semiconductor layer, respectively, are formed on the gate metal 216.

Figure 9:
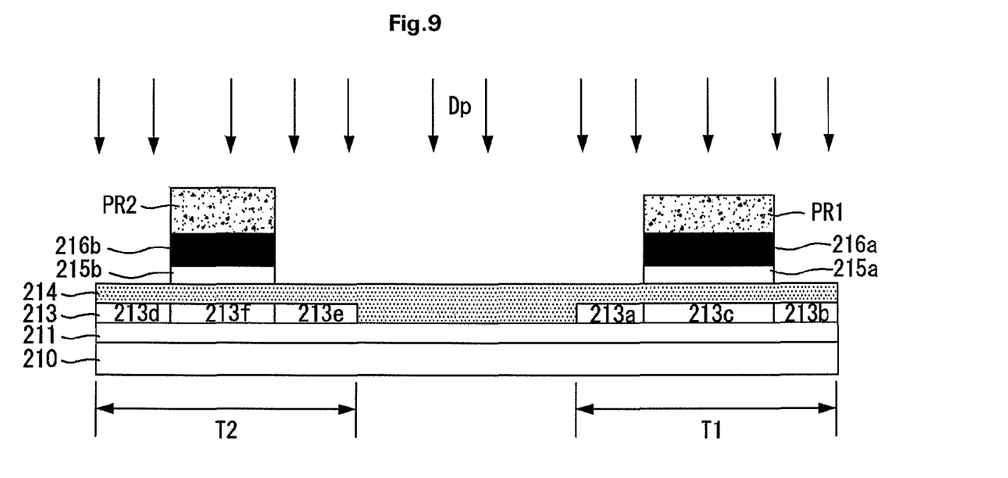

Next, as shown in FIG. 9, portions of the gate metal 216 and the transparent metal 215 are removed by using the first photoresistor PR1 and the second photoresistor PR2, and a first gate 216a, a first transparent electrode 215a, a second gate 216b, and a second transparent electrode 215b are formed. Dry etching (D/E) may be used for removing a portion of the gate metal 216, and wet etching (W/E) may be used for removing a portion of the transparent metal 215. However, the present invention is not restricted thereto.

Next, as shown in FIG. 9, source and drain regions 213a and 213b of the first semiconductor layer and source and drain regions 213d and 213e of the second semiconductor layer are doped (Dp) with impurities. The impurities may be a P-type or N-type.

Figure 10:
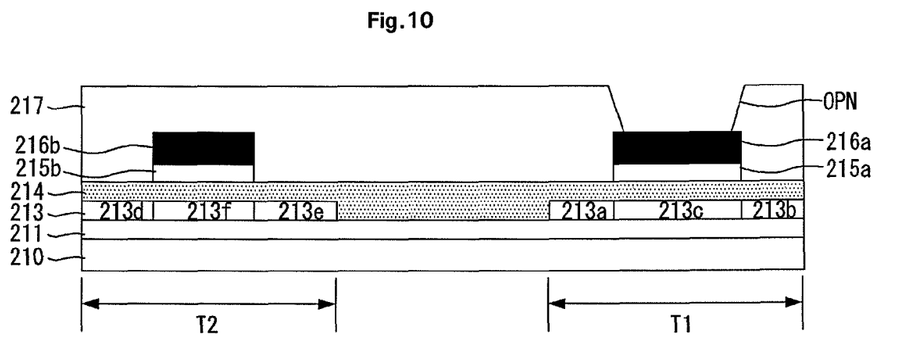

Next, as shown in FIG. 10, the first photoresistor Pr1 and the second photoresistor PR2 are removed, and a second insulating film 217 is formed on the first gate 216a and the second gate 216b. The second insulating film 217 may be made of silicon oxide (SiOx), silicone nitride (SiNx), or multi-layers thereof, but is not restricted thereto.

Next, as shown in FIG. 10, an opening exposing the first gate 216a is formed on the second insulating film 217. Although not shown, openings OPN are formed in the source and drain regions 213a and 213b of the first semiconductor layer and the source and drain regions 213d and 213e of the second semiconductor layer, as well as in the region exposing the first gate 216a. In other words, the illustrated opening OPN is formed in the same manner simultaneously with the formation of openings that expose the source and drain regions 213a and 213b of the first semiconductor layer and the source and drain regions 213d and 213e of the second semiconductor layer.

Figure 11:
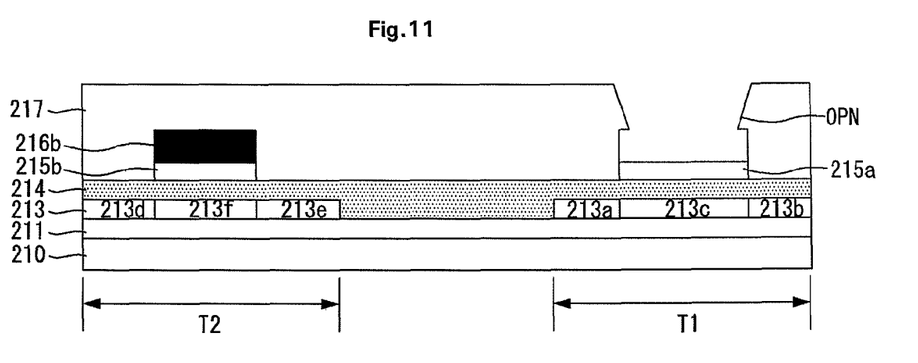

Next, as shown in FIG. 11, the first gate 216 exposed through the opening OPN formed on the second insulating film 217 is removed. Although not shown, the first gate 216a may be removed along with the removal of portions of the source and drain which are formed on the second insulating film 217 so as to contact the source and drain regions 213a and 213b of the first semiconductor layer and the source and drain regions 213d and 213e of the second semiconductor layer.

Figure 12:
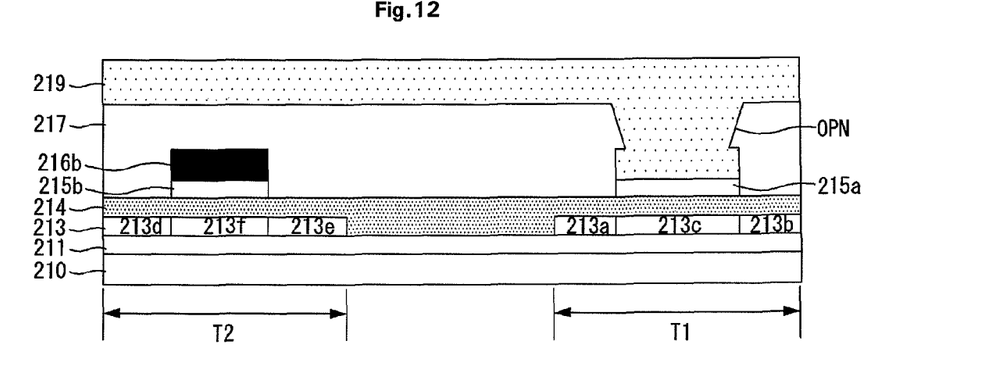

Next, as shown in FIG. 12, a third insulating film 219 is formed on the second insulating film 217. The third insulating film 219 may be made of silicon oxide (SiOx), silicone nitride (SiNx), or multi-layers thereof, but is not restricted thereto.

As for the above-described thin film transistor in accordance with the exemplary embodiment of the present invention, a mask process for carrying out an impurity doping process on the source and drain regions of the semiconductor layer is omitted in the process of forming a phototransistor and a normal transistor on the substrate. This is because, as the mask is replaced with the first and second transparent electrodes formed on the first insulating film, a self-aligned doping is enabled. Additionally, the thin film transistor in accordance with the exemplary embodiment of the present invention can improve reliability and enhance production yield and product competitiveness since a phototransistor and a normal transistor have the same structure.

Hereinafter, a light emitting display manufactured according to the second exemplary embodiment of the present invention will be described.

Figure 13:
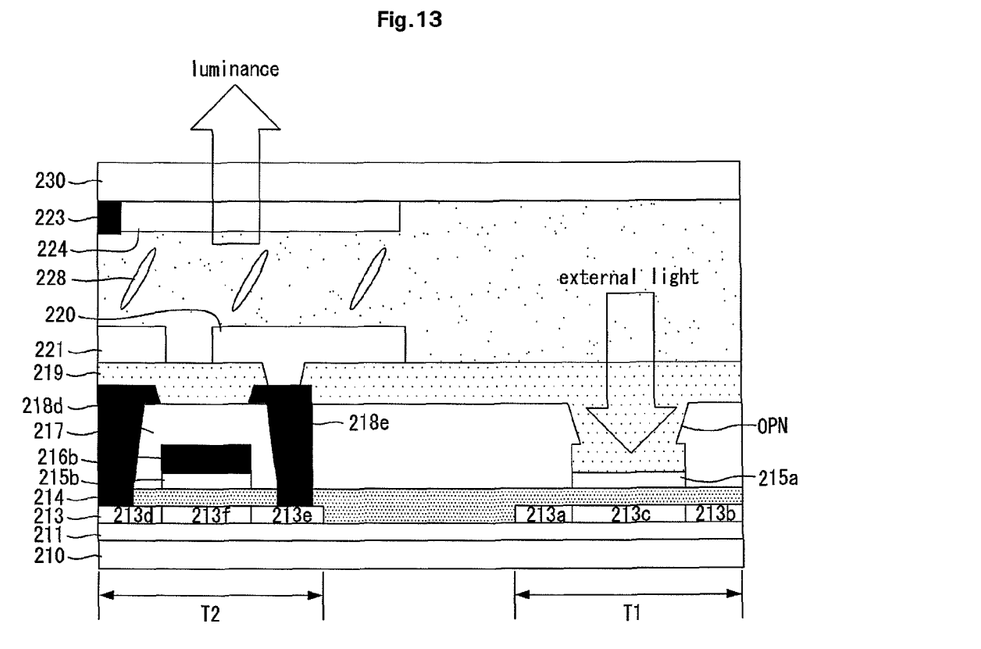
FIG. 13 is a schematic cross sectional view of a liquid crystal display manufactured in accordance with the second exemplary embodiment.

As shown in FIG. 13, a first substrate 210 defining a first transistor region T1 and a second transistor region T2 is disposed on a panel of an organic light emitting display manufactured in accordance with the second exemplary embodiment of the present invention.

A buffer layer 211 is disposed on the first substrate 210. The buffer layer 211 may be formed to protect a transistor to be formed in a subsequent process from impurities such as an alkali ion leaking from the substrate 210. The buffer layer 211 may be made of silicone oxide (SiOx), silicone nitride (SiNx), or the like.

A first semiconductor layer 213a, . . . , 213c and a second semiconductor layer 213d, . . . , 213f partitioned off on the first transistor region T1 and on the second transistor region T2 are disposed on the buffer layer 211. The first semiconductor layer 213a, . . . , 213c and the second semiconductor layer 213d, . . . , 213f may include amorphous silicon or crystallized polycrystalline silicon.

A first insulating film 214 is formed on the first semiconductor layer 213a, . . . , 213c and the second semiconductor layer 213d, . . . , 213f. The first insulating film 214 may be made of silicon oxide (SiOx), silicone nitride (SiNx), or multi-layers thereof, but is not restricted thereto.

On the first insulating film 214, a first transparent electrode 215a disposed on the channel region 213c of the first semiconductor layer and a second transparent electrode 215b disposed on the channel region 213f of the second semiconductor layer may be formed on the first insulating film 214. The first and second transparent electrodes 215a and 215b may be formed of any one of ITO (Indium Tin Oxide), IZO (Indium Zinc Oxide), ITZO (Indium Tin Zinc Oxide), and AZO (Zno doped A1203), but are not restricted thereto.

A second gate 216b is disposed on the second transparent electrode 215b. The second gate 216b may be formed of a single layer or multi-layer formed of any one selected from the group consisting of molybdenum (Mo), aluminum (Al), chromium (Cr), gold (Au), titanium (Ti), nickel (Ni), neodymium (Nd) and copper (Cu), or a combination thereof.

A second insulating film 217 having an opening exposing the first transparent electrode 215a is formed on the first transparent electrode 215a and the second gate 216b. The second insulating film 217 may be made of silicon oxide (SiOx), silicone nitride (SiNx), or multi-layers thereof, but is not restricted thereto.

A source 218d and a drain 218e which contact the source and drain regions 213d and 213e of the second semiconductor layer are disposed on the second insulating film 217. Although not shown, the source and drain are disposed so as to be in contact with the source and drain regions 213a and 213b of the first semiconductor layer.

A third insulating film 219 exposing the source 218d or the drain 218e is disposed on the source and drain 218d and 218e. The third insulating film 219 may be made of silicon oxide (SiOx), silicone nitride (SiNx), or multi-layers thereof, but is not restricted thereto.

A pixel electrode 220 contacting the source 218d or drain 218e and a common electrode 221 connected to a common voltage line (not shown) are disposed on the third insulating film 219. The pixel electrode 220 and the common electrode 221 may be formed of any one of ITO (Indium Tin Oxide), IZO (Indium Zinc Oxide), ITZO (Indium Tin Zinc Oxide), and AZO (Zno doped A1203), but are not restricted thereto.

A black matrix 223 is disposed on the second substrate 230 facing the first substrate 210. The black matrix 223, which is a non-display area, is made of a photosensitive organic material having a black pigment added thereto. As the black pigment, carbon black or titanium oxide can be used, but the present invention is not limited thereto.

A color filter 224 is disposed between the black matrixes 223. The color filter 224 may be formed of filters of red, green, and blue, or may be formed of filters of other colors. Although not shown, according to the driving mode of the liquid crystal display, an overcoat layer may be disposed on the black matrices 223 and the color filter 224.

In case of the liquid crystal display having the above-described structure, the first substrate 210 and the second substrate 230 facing each other are joined and sealed together with a liquid crystal layer interposed therebetween. The liquid crystal display manufactured as above may comprise a data driver and a scan driver that supply a data signal and a scan signal. Therefore, the light emitting display in accordance with the exemplary embodiment can be manufactured as a display device capable of representing an image by polarizing light emitted from a backlight unit by a data signal and a scan signal that are supplied from the data driver and the scan driver.

Meanwhile, a phototransistor is formed in the first transistor region T1, and a normal transistor is formed in the second transistor region T2. In the exemplary embodiment, the first transistor formed in the first transistor region T1 may operates as a phototransistor for sensing external light, and the second transistor formed in the second transistor region may operate as a normal transistor for driving an organic light emitting diode formed in a pixel area. Accordingly, the organic light emitting display in accordance with the exemplary embodiment is able to adjust the luminance of a pixel by means of external light.

A method of adjusting the luminance of a pixel by using a phototransistor is one of the methods for adjusting the luminance of a display device, so that those skilled in the art may implement the present invention by configuring the phototransistor circuitally so as to work in conjunction with the data driver. According to the method of adjusting the luminance of a pixel by using a phototransistor, the luminance of a pixel can be increased in a bright environment, while the luminance of a pixel can be decreased in a dark environment, thereby improving visibility and reducing power consumption. Consequently, the exemplary embodiment can provide a thin film transistor and an organic light emitting display that can realize an ALS (Ambient Light Sensor).

As described above, the exemplary embodiments of the present invention can provide a thin film transistor and a thin film transistor fabricating method which can improve the reliability and production yield of a normal transistor and a phototransistor. Further, the exemplary embodiments of the present invention can provide a phototransistor capable of adjusting the luminance of a panel and a display device capable of improving visibility and reduce power consumption.

The foregoing embodiments and advantages are merely exemplary and are not to be construed as limiting the present invention. The present teachings can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures. Moreover, unless the term "means" is explicitly recited in a limitation of the claims, such as limitation is not intended to be interpreted under 35 USC 112 (6).

The invention claimed is:

1. A display device, comprising:
a first transistor region and a second transistor region defined on a substrate;
a first transistor disposed on the first transistor region, the first transistor comprises a first semiconductor layer having source, channel, and drain regions defined on the substrate, a first insulating film disposed on the first semiconductor layer, a first transparent electrode disposed on the first insulating film and formed corresponding to the channel region of the first semiconductor layer, and a second insulating film disposed on the first transparent electrode;
a second transistor disposed on the second transistor region, the second transistor comprises a second semiconductor layer having source, channel, and drain regions defined on the substrate, the first insulating film disposed on the second semiconductor layer, a second transparent electrode disposed on the first insulating film and formed corresponding to the channel region of the second semiconductor layer, a second gate disposed on the second transparent electrode, and a second insulating film disposed on the second gate; and
a pixel comprising an organic light emitting diode disposed on the second transistor,
wherein the first transistor is a phototransistor for sensing external light and the second transistor is a switching transistor for driving the organic light emitting diode,
wherein the first transistor adjust the luminance of the organic light emitting diode by external light.

2. a display device, comprising:
a first transistor region and a second transistor region defined on a substrate;
a first transistor disposed on the first transistor region, the first transistor comprises a first semiconductor layer having source, channel, and drain regions defined on the substrate, a first insulating film disposed on the first semiconductor layer, a first transparent electrode disposed on the first insulating film and formed corresponding to the channel region of the first semiconductor layer, and a second insulating film disposed on the first transparent electrode;
a second transistor disposed on the second transistor region, the second transistor comprises a second semiconductor layer having source, channel, and drain regions defined on the substrate, the first insulating film disposed on the second semiconductor layer, a second transparent electrode disposed on the first insulating film and formed corresponding to the channel region of the second semiconductor layer, a second gate disposed on the second transparent electrode, and a second insulating film disposed on the second gate; and
a pixel comprising a liquid crystal layer disposed on the second transistor;
wherein the first transistor is a phototransistor for sensing external light and the second transistor is a switching transistor for driving the liquid crystal layer,
wherein the first transistor adjust the luminance of a organic light emitting diode by external light.

3. The display device of claim 1,
wherein the first transistor for increasing the luminance of the pixel in a bright environment and decreasing the luminance of the pixel in a dark environment.

4. The display device of claim 1,
wherein the second transistor comprising a third insulating film disposed on the source or the drain, the third insulating film exposing the source or the drain.

5. The display device of claim 1,
wherein the organic light emitting diode comprises a lower electrode disposed on the third insulating film, the lower electrode contacting the source or drain, an organic light emitting layer disposed on the lower electrode, and an upper electrode disposed on the organic light emitting layer.

6. The display device of claim 2,
wherein the first transistor for increasing the luminance of the pixel in a bright environment and decreasing the luminance of the pixel in a dark environment.

7. The display device of claim 2,
wherein the second transistor comprising a third insulating film disposed on the source or the drain, the third insulating film exposing the source or the drain.

8. The display device of claim 7,
further comprises a pixel electrode disposed on the third insulating film,
a common electrode connected to a common voltage line,
a second substrate facing the first substrate comprising a black matrix disposed on the second substrate and a color filter disposed between the black matrix.

* * * * *